(12) United States Patent
Flatté et al.

(10) Patent No.: US 7,719,071 B1
(45) Date of Patent: May 18, 2010

(54) BIPOLAR SPIN TRANSISTORS AND THE APPLICATIONS OF THE SAME

(75) Inventors: Michael Edward Flatté, Iowa City, IA (US); Zhi Gang Yu, Mountain View, CA (US); Ezekiel Johnston-Halperin, San Dimas, CA (US); David Awschalom, Santa Barbara, CA (US)

(73) Assignee: University of iowa Research Foundation, Iowa City, IA (US)

( * ) Notice: Subject to any disclaimer, the term of this patent is extended or adjusted under 35 U.S.C. 154(b) by 0 days.

(21) Appl. No.: 10/854,022

(22) Filed: May 26, 2004

Related U.S. Application Data

(60) Provisional application No. 60/473,848, filed on May 27, 2003.

(51) Int. Cl.
    *H01L 47/02* (2006.01)
(52) U.S. Cl. .............................. 257/427; 257/E43.001; 257/E29.167; 257/E29.323
(58) Field of Classification Search .................. 257/197, 257/421, 423, 427, 108, E43.001, E27.005, 257/E29.167, E29.323, 422
See application file for complete search history.

(56) References Cited

U.S. PATENT DOCUMENTS

| | | | | |
|---|---|---|---|---|
| 5,432,373 A | * | 7/1995 | Johnson | 257/421 |
| 5,962,905 A | * | 10/1999 | Kamiguchi et al. | 257/421 |
| 6,696,737 B2 | * | 2/2004 | Flatte et al. | 257/421 |
| 6,753,562 B1 | * | 6/2004 | Hsu et al. | 257/295 |
| 6,873,545 B2 | * | 3/2005 | Johnson | 365/158 |

OTHER PUBLICATIONS

Ohno et al. "Electric-field control of ferromagnetism," Nature, 40, Dec. 2000, 944-946.*
Gupta et al. "Ultrafast Manipulation of Electron Spin Coherence" Science, 292, Jun. 2001, 2458-2461.*
Flatte et al. "Unipolar spin diode and tranistors," Applied Physics Letters vol. 78 p. 1273, Feb. 2001.*
Fabian et al., "Theory of magnetic bipolar transistors" arXiv:cond-mat/0211639 v1 Nov. 27, 2002.

* cited by examiner

*Primary Examiner*—Davienne Monbleau
*Assistant Examiner*—Matthew Reames
(74) *Attorney, Agent, or Firm*—Ballard Spahr LLP

(57) ABSTRACT

A bipolar spin transistor is provided. In one embodiment of the present invention, the bipolar spin transistor includes a first semiconductor region having a first conductivity type, a second semiconductor region having a second conductivity type that is different from the first conductivity type and also having a spin polarization, and a third semiconductor region having a conductivity type that is the same conductivity type of the first semiconductor region. The first semiconductor region and the second semiconductor region are adjacent to each other so as to form a first charge depletion layer therebetween, the first charge depletion layer having a first side facing the first semiconductor region and an opposing second side facing the second semiconductor region. Additionally, the second semiconductor region and the third semiconductor region are adjacent to each other so as to form a second charge depletion layer therebetween, the second charge depletion layer having a first side facing the second semiconductor region and an opposing second side facing the third semiconductor region.

3 Claims, 2 Drawing Sheets

BIPOLAR SPIN TRANSISTORS AND THE APPLICATIONS OF THE SAME

CROSS-REFERENCE TO RELATED APPLICATION

This application claims priority to U.S. provisional application No. 60/473,848, filed May 27, 2003, which document is incorporated herein in its entirety by this reference.

STATEMENT OF FEDERALLY SPONSORED RESEARCH OR DEVELOPMENT

This work was supported in part by DARPA/ARO DAAD19-01-0490, DARPA/ONR N00014-99-1-1096, and the ARO MURI DAAD19-01-1-0541.

BACKGROUND OF THE INVENTION

1. Field of the Invention

The present invention generally relates to a transistor. More particularly, the present invention relates to a bipolar transistor through a mechanism based on spin polarization.

2. Description of the Related Art

Most semiconductor devices are based on the p-n diode or the transistor. A large class of transistors are the so-called bipolar transistors consisting of back to back p-n diodes either in a p-n-p or n-p-n arrangement. By controlling the chemical potential of the middle region (called the base) the collector current ($I_C$) can be varied, and $I_C$ depends on the base voltage ($V_{EB}$) exponentially.

The development of transistors and its later evolution into the integrated circuit or microchip revolutionized people's daily life and the world. Continuous efforts have been made to find new types of diodes and transistors.

Until recently, the emerging field of magneto electronics has focused on magnetic metals for conducting components (hereinafter "[n]" referring to the nth reference in the attached list of references at the end of the specification). Multilayer magnetoelectronic devices, such as giant magnetoresistive ("GMR") and magnetic tunnel junction (MTJ) devices, have revolutionized magnetic sensor technology and hold promise for reprogrammable logic and nonvolatile memory applications. The performance of these devices improves as the spin polarization of the constituent material approaches 100%, and thus there are continuing efforts to find 100% spin-polarized conducting materials.

Doped magnetic semiconductors are a promising direction towards such materials, for the bandwidth of the occupied carrier states is narrow. For example, for nondegenerate carriers and a spin splitting of 100 meV the spin polarization will be 98% at room temperature. To date high-temperature ($T_{Curie} > 100K$) ferromagnetic semiconductors such as $Ga_{1-x}Mn_x$As are effectively p-doped. Semi-magnetic n-doped semiconductors like BeMnZnSe, however, have already been shown to be almost, 100% polarized (in the case of BeMnZnSe in a 2T external field at 30K). Both resonant tunneling diodes (RTDs) and light-emitting diodes (LEDs) have been demonstrated which incorporate one layer of ferromagnetic semiconductor. It is inevitable that devices incorporating multiple layers of ferromagnetic semiconducting material will be constructed. Note that "ferromagnetic semiconducting material" or "ferromagnetic semiconductor" as used in this specification includes any magnetic and semi-magnetic semiconductors that is a semiconductor and has a spin polarization, which can be affected by or interact with a magnetic field.

Previous research efforts have been directed to the transport properties of specific device geometries based on multilayers of spin-polarized unipolar doped semiconductors, including spin transport in homogeneous semiconductors and calculations of spin filtering effects in superlattices. Reference is made to commonly assigned U.S. patent application Ser. No. 10/014,925 and its entire contents are hereby incorporated by reference thereto into the present patent application.

One motivation for semiconductor spin electronics has been the seminal suggestion of Datta and Das of a "spin transistor". A burst of recent activity demonstrating controllable fabrication of ferromagnetic semiconductors and their incorporation into heterostructures has led to several additional device suggestions. These include a "spin filter", "spin-RTD", "unipolar spin transistor", "magnetic Zener tunnel diode", and "magnetic p-n diode". At the same time, progress on the problem of spin injection into nonmagnetic semiconductors has been reported, both from magnetic semiconductors and from magnetic metals. Hybrid transistor devices incorporating both semiconductors and ferromagnets, such as the spin-valve transistor, have demonstrated magnetoresistances exceeding 300%, but suffer from low efficiency for current transport through the base to the collector. Additional hybrid systems are also under development.

SUMMARY OF THE INVENTION

In one aspect, the present invention provides a bipolar spin transistor. In one embodiment of the present invention, the bipolar spin transistor includes a first semiconductor region having a first conductivity type, a second semiconductor region having a second conductivity type that is different from the first conductivity type and also having a spin polarization, and a third semiconductor region having a conductivity type that is the same conductivity type of the first semiconductor region. The first semiconductor region and the second semiconductor region are adjacent to each other so as to form a first charge depletion layer therebetween, the first charge depletion layer having a first side facing the first semiconductor region and an opposing second side facing the second semiconductor region. Additionally, the second semiconductor region and the third semiconductor region are adjacent to each other so as to form a second charge depletion layer therebetween, the second charge depletion layer having a first side facing the second semiconductor region and an opposing second side facing the third semiconductor region.

When a majority carrier in the first semiconductor region moves across the first charge depletion layer from the first side of the first charge depletion layer to the second side of the first charge depletion layer, the majority carrier in the first semiconductor region becomes a minority carrier in the second semiconductor region, and when the minority carrier in the second semiconductor region moves across the second charge depletion layer from the first side of the second charge depletion layer to the second side of the second charge depletion layer, the minority carrier in the second semiconductor region becomes a majority carrier in the third semiconductor region.

Likewise, when a majority carrier in the third semiconductor region moves across the second charge depletion layer from the second side of the second charge depletion layer to the first side of the second charge depletion layer, the majority carrier in the third semiconductor region becomes a minority carrier in the second semiconductor region, and when the minority carrier in the second semiconductor region moves across the first charge depletion layer from the second side of the first charge depletion layer to the first side of the first charge depletion layer, the minority carrier in the second semiconductor region becomes a majority carrier in the first semiconductor region.

In one embodiment of the present invention, both the first semiconductor region and the third semiconductor region comprise a p-type semiconductor layer. The second semiconductor region comprises an n-type semiconductor layer. The n-type semiconductor layer of the second semiconductor region is ferromagnetic, and the spin polarization of the second semiconductor region is either up or down.

In another embodiment of the present invention, both the first semiconductor region and the third semiconductor region comprise a n-type semiconductor layer. The second semiconductor region comprises an p-type semiconductor layer. The p-type semiconductor layer of the second semiconductor region is ferromagnetic, and the spin polarization of the second semiconductor region is either up or down.

The transistor further includes a substrate of either an insulating material or a semi-insulating material, wherein the substrate supports the first semiconductor region, the second semiconductor region and the third semiconductor region.

In yet another aspect, the present invention provides a method of changing amplitude and/or spin polarization of electric current. In one embodiment of the present invention (FIG. 2), the method includes the steps of providing a semiconductor material having a first region, a second region, and a third region, wherein the first region is adjacent to the second region so as to form a first domain between the first region and the second region (201), and the second region is adjacent to the third region so as to form a second domain between the second region and the third region (202), providing a first voltage between the first region and the second region to cause carriers to move across the first domain from the first region to the second region (203), and generating a second voltage between the second region and the third region to cause the carriers move across the second domain from the second region to the third region and the second voltage has an amplitude different from that of the first voltage (204).

In one such embodiment, the first region and the third region have no spin polarization and the second region has a spin polarization.

In a further aspect, the present invention provides an apparatus for changing the amplitude of electric signals. In one embodiment of the present invention, the apparatus includes a semiconductor material having a first region, a second region, and a third region, wherein the first region is adjacent to the second region so as to form a first domain between the first region and the second region, and the second region is adjacent to the third region so as to form a second domain between the second region and the third region. The apparatus further has means for providing a first voltage between the first region and the second region to cause carriers to move across the first domain from the first region to the second region, and means for generating a second voltage between the second region and the third region to cause the carriers move across the second domain from the second region to the third region and the second voltage has an amplitude different from that of the first voltage, wherein the first region and the third region have no spin polarization and the second region has a spin polarization.

Bipolar transistors with a ferromagnetic base of the present invention can potentially generate almost 100% spin-polarized current injection into nonmagnetic semiconductors. Optical control of ferromagnetism and spin splitting in the base can lead to either long-lived or ultrafast switching behavior. Fringe field control of the base magnetization can be used for information transfer between metallic magnetoelectronics and conventional semiconducting electronics.

Highly spin-polarized current of the present invention can be used as part of a magnetic field sensing device, such as a magnetic hard drive read head. If the magnetic base of the transistor were used as the "free" layer in a spin valve, then the spin polarization of the current coming from the transistor would be close to 100% and correlated with the field from the drive medium. Because the amplitude of the voltage signal detected in a spin valve is proportional to the polarization of the current through the free layer of the spin valve, this would lead to a larger signal and improved detection of the magnetic field orientation. In an alternative configuration, the magnetic bipolar transistor base is the "pinned layer" and another magnetic layer is the free layer.

The dependence of the spin current through the transistor on the orientation of the base can be used to implement an information storage device. As part of the spin valve configuration described above, information can be stored by configuring the free magnetic layer to be magnetized parallel or antiparallel to the pinned layer. Optical creation of spin-polarized carriers in the magnetic base can be used to re-orient the magnetization direction, and hence "write" information into the device. Alternatively, electrical manipulation of magnetization can be used by depleting the magnetic base and then re-orienting the magnetization with a small fringe field, or by using spin current torque for switching the magnetic base. Optical illumination of the base sub-band gap can permit coherent rotation of the magnetization via the AC Stark effect. The above described techniques provide methods of switching an information storage device consisting of the magnetic bipolar transistor with another (pinned) magnetic layer. The information (relative orientation of the two magnetic layers) can be detected by measuring the resistance of the device. The use of the magnetic bipolar transistor enables access to nearly 100% spin-polarized currents, which enhance signal strength.

Magnetoelectronic devices can be integrated based on magnetic metals and semiconductor devices by permitting the fringe field of a component of a magnetoelectronic device based on magnetic metals to influence the magnetization of the base layer in the magnetic bipolar transistor. Information in the metallic device is embodied in the magnetization orientation; that information can be transferred to the magnetization orientation of the magnetic layer in the magnetic bipolar transistor. The current and voltage output of the magnetic bipolar transistor are fully compatible with other semiconductor electronic devices.

The present invention is directed to a new general class of semiconductor devices, based on bipolar junction transistors, but enhanced in functionality by the use of a magnetic semiconductor in one or more regions of the device. One preferred embodiment of the present invention utilizes a magnetic semiconductor as the base of a bipolar transistor while the emitter and collector remain nonmagnetic. Alternative embodiments can utilize a magnetic semiconductor for any transistor region (emitter, collector or base). Throughout this specification, the direction of magnetization will be indicated by the subscript $\uparrow$ or $\downarrow$, oriented along the direction of magnetization. While the specification principally describes n-p$\uparrow$-n transistor structures such as that shown in FIG. 1, p-n$\uparrow$-p transistors can also be developed in an analogous way. While traditional (Ga, Mn) As grown as a random alloy is inherently p-type, recent advances in the synthesis of digital ferromagnetic heterostructures allow independent control of electronic and magnetic properties. This can allow for the implementation of either transistor geometry.

These and other aspects will become apparent from the following description of the invention, although variations and modifications may be effected without departing from the spirit and scope of the novel concepts of the disclosure.

BRIEF DESCRIPTION OF THE DRAWINGS

The accompanying drawings, which are incorporated in and constitute a part of this specification, illustrate embodiments of the invention and together with the description, serve to explain the principles of the invention.

DETAILED DESCRIPTION OF THE INVENTION

Figure 1A:
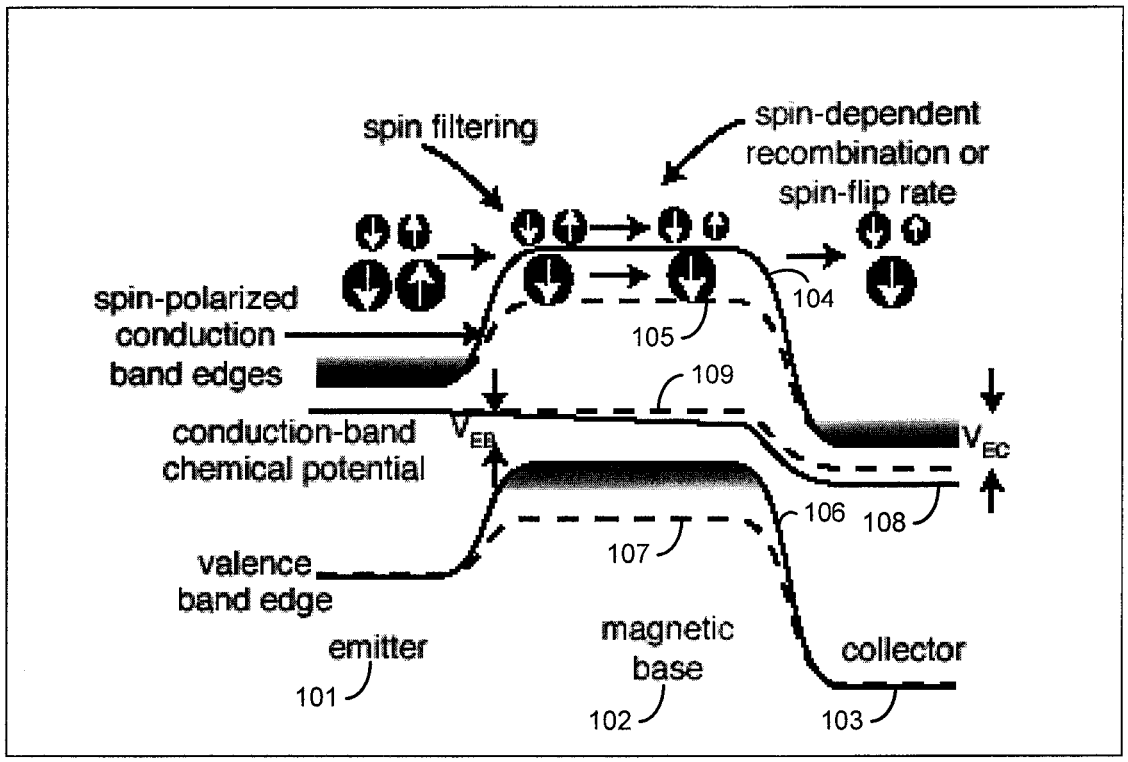
FIG. 1A provides a schematic diagram of an n-p↑-n transistor that may incorporate the present invention.

One or more preferred embodiments of the invention are now described in detail hereinbelow and in the attachments hereto. Referring to the drawings, like numbers indicate like parts throughout the views. As used in the description herein and attachments hereto, the meaning of "a," "an," and "the" includes plural reference unless the context clearly dictates otherwise. Also, as used in the description herein and attachments hereto, the meaning of "in" includes "in" and "on" unless the context clearly dictates otherwise. Finally, as used in the description herein and attachments hereto, the meanings of "and" and "or" include both the conjunctive and disjunctive and may be used interchangeably unless the context clearly dictates otherwise.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

The present invention is directed to a new general class of semiconductor devices based on bipolar junction transistors enhanced in functionality by the use of a magnetic semiconductor in one or more regions of the device. The present invention can employ a magnetic semiconductor in any combination of transistor regions, either alone or in combination, including the emitter, collector or base. In some preferred embodiments, a magnetic semiconductor is used as the base of a bipolar transistor while the emitter and collector remain nonmagnetic. Such embodiments can include either n-p-n or p-n-p transistor structures.

Figure 1B:
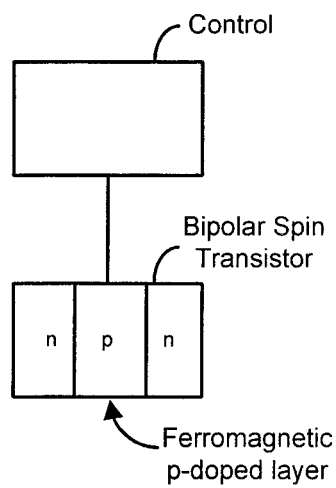
FIG. 1B provides an exemplary schematic diagram of a ferromagnetic layer of a bipolar spin transistor coupled to a control.
Figure 2:
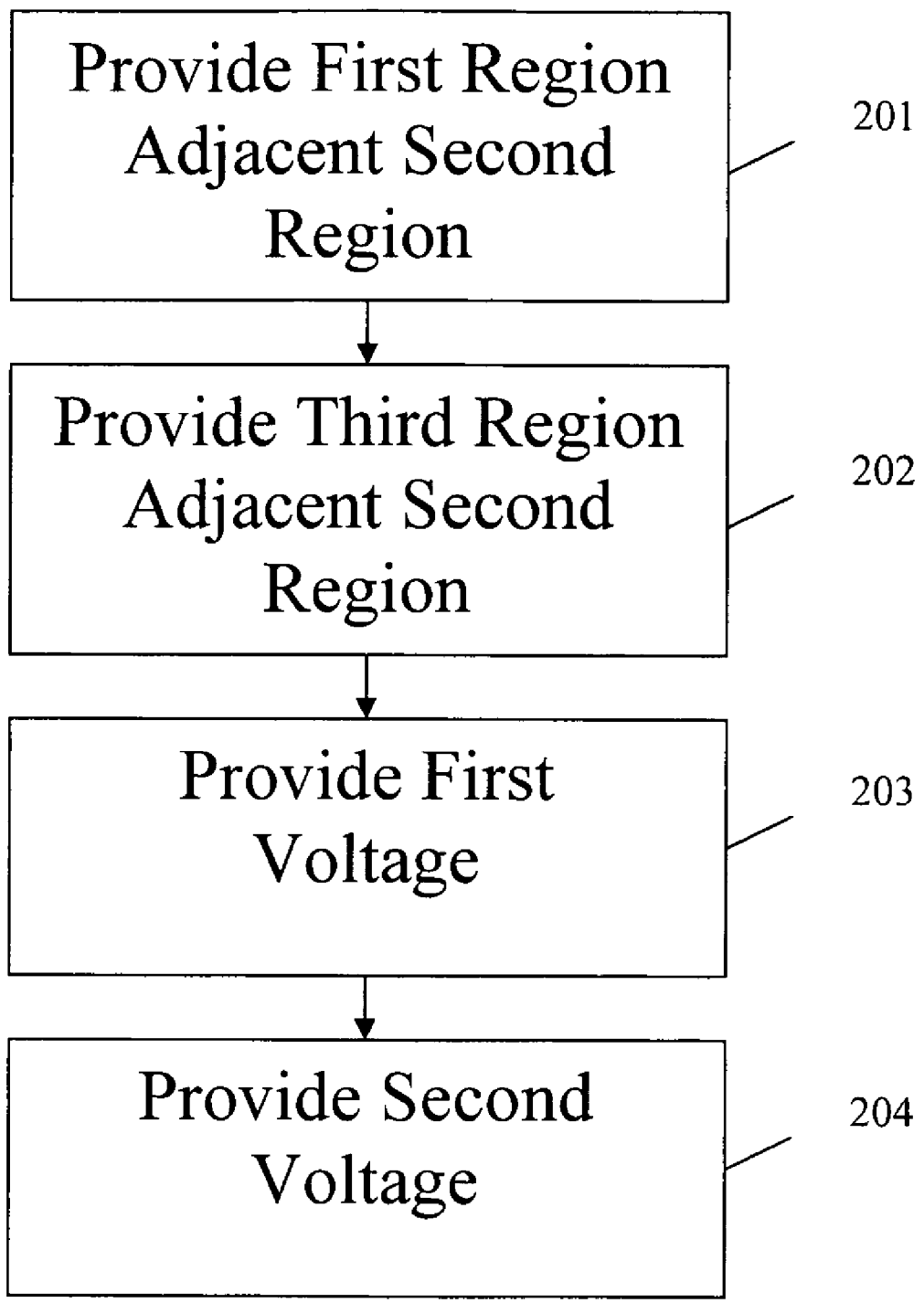
FIG. 2. is a flow diagram depicting an overall method that may be performed by the present invention.

FIG. 1 depicts an exemplary n-p↑-n transistor. As depicted in FIG. 1, thermally excited unpolarized electrons in the emitter 101 are filtered at the emitter 101-base 102 interface and can be further polarized through spin relaxation or carrier recombination in the base 102. The result is a highly spin polarized current in the nonmagnetic collector 103. The spin-split conduction and valence band edges 104-107 are shown in the magnetic base 102, as well as the conduction band quasi-chemical potential 108, 109. Dashed lines 105, 107, 109 indicate spin-down, and solid lines 104, 106, 108 indicate spin-up. Occupied states (electron or hole) are indicated with shading.

In this structure, three general spin-selective processes can potentially cause minority electrons in the p-doped base 102, which were injected from the nonmagnetic n-doped emitter, to become spin-polarized before passing into the collector. The first is a spin-filtering effect on carriers passing from the emitter to the p↑ base 102, the second is spin-selective conduction electron spin flipping within the p↑ region, and the third is spin-selective recombination within the p↑ region. The result is a large current of highly spin-polarized electrons into the nonmagnetic collector of the device. This spin-polarized current can be controlled by any scheme which controls the orientation or magnitude of the base magnetization. The influence of these processes on the spin polarization of the collector current is calculated within "generalized Shockley approximations," namely that the transport in the emitter 101, base 102, and collector 103 is diffusive [16z], that transport through the depletion layers is ballistic, and that recombination and spin flipping can be neglected in the depletion regions.

The spin filtering effect originates from the spin splitting of the minority (conduction electron) band edges in the p↑ base (shown in FIG. 1 as 104, 105). It is well-known that the valence band is spin-split in a p-doped magnetic semiconductor such as GaMnAs, and estimates of this spin splitting range from 20-100 meV (106, 107). The conduction band should be split as well through hybridization with the valence band and the d-levels, although most likely by a smaller energy ($S_c$). Studies of II-VI magnetic semiconductors indicate that the conduction-band spin splitting will be roughly a factor of five smaller than that of the valence band. The influence of the conduction band spin splitting on the transistor of the present invention is quite dramatic even for small splittings, for the equilibrium spin polarization of minority carriers in the base 102, $$\frac{n_{B\downarrow o} - n_{B\uparrow o}}{n_{B\downarrow o} + n_{B\uparrow o}} = \tanh(S_c/2k_B T). \tag{1}$$

where $n_{Bso}$ is the equilibrium density of spin s conduction electrons in the base 102. When the device is biased, the Shockley approximations fix the minority carrier quasichemical potential on the emitter 101 side of the base 102 equal to the chemical potential in the emitter 101 (FIG. 1). In an ordinary transistor this gives rise to the exponential dependence of the base's minority carrier density on the emitter-base voltage, $V_{EB}$. For a magnetic base 102 the enhanced minority carrier densities $n_{Bs}$ injected from the emitter 101 will likewise increase exponentially, and retain the spin polarization of Eq. (1), $$\frac{n_{B\downarrow}}{n_{B\uparrow}} = \frac{n_{B\downarrow o}}{n_{B\uparrow o}}. \tag{2}$$

If the band alignment is as shown in FIG. 1 then $n_{B\downarrow} > n_{B\uparrow}$, however the other case is straightforward. The degree of spin polarization is considerably more dramatic than that expected for tunneling through a spin-split barrier and occurs in any base region thick enough to eliminate tunneling from emitter 101 to collector 103.

The other two effects may dominate when the base 102 is thick enough either for spin flipping or for selective carrier recombination to substantially modify the minority carrier spin polarization. Spin-selective conduction electron spin flipping can originate, e.g., from the spin polarization of the hole sea via an electron-hole scattering process. If $n_{B\downarrow}/\tau_{\downarrow\uparrow} = n_{B\uparrow}/\tau_{\uparrow\downarrow}$, and neglecting spin-selective carrier recombination, then there is a quasi-equilibrium electron spin polarization in the base 102 given by $$\frac{n_{B\downarrow} - n_{B\uparrow}}{n_{B\downarrow} + n_{B\uparrow}} = \frac{\tau_{\downarrow\uparrow} - \tau_{\uparrow\downarrow}}{\tau_{\downarrow\uparrow} - \tau_{\uparrow\downarrow}}. \quad (3)$$

Near equilibrium the polarization from Eq. (3) will equal that from Eq. (1) due to detailed balance. For $n_B \gg n_{Bo}$, however, the values could be different, as $\tau_{\downarrow\uparrow}$, and $\tau_{\uparrow\downarrow}$, are dependent on the densities $n_{Bs}$. As a result, even though the chemical potential of minority electrons is not spin-split at the emitter 101 side of the base 102 [giving rise to Eq. (1)], because the electrons are out of equilibrium with the holes, the spin relaxation processes of the electron and hole spin densities could result in a spin-split electron chemical potential 108, 109. Again, for a thick enough base, this minority spin polarization [Eq. (3)] would determine the spin polarization of the collector current. Spin-selective carrier recombination most likely will occur due to the spin polarization of the hole sea, and a simple model predicts $\tau_{R\downarrow}/\tau_{R\uparrow} = p_\uparrow/p_\downarrow$. Unlike the other mechanisms, spin polarization generated this way will continue to increase as the base region thickness is increased, however the transport efficiency across the base will suffer.

As the collector current is proportional to the minority carrier density in the base, for the case of a thin base and in the absence of other spin-dependences in carrier transport, the collector current spin polarization will be given simply by Eq. (1), and for a thick base if recombination can be neglected, by Eq. (3). For more general cases the spin-selective transport can be described by one-dimensional drift-diffusion equations for the minority electrons.

$$Ev_\uparrow \frac{\partial n_\uparrow}{\partial z} + D_\uparrow \frac{\partial^2 n_\uparrow}{\partial z^2} = \frac{n_\uparrow}{\tau_{\uparrow\downarrow}} - \frac{n_\downarrow}{\tau_{\downarrow\uparrow}} + \frac{n_\uparrow}{\tau_{R\uparrow}} \quad (4)$$

$$Ev_\downarrow \frac{\partial n_\downarrow}{\partial z} + D_\downarrow \frac{\partial^2 n_\downarrow}{\partial z^2} = \frac{n_\downarrow}{\tau_{\downarrow\uparrow}} - \frac{n_\uparrow}{\tau_{\uparrow\downarrow}} + \frac{n_\downarrow}{\tau_{R\downarrow}} \quad (5)$$

These equations must be solved self-consistently with the Poisson equation. Analytic solutions can be obtained for the device properties from Eqs. (4)-(5) for the simplified (but plausible) case of negligible spin relaxation in the base. Spin relaxation times measured in highly ($2.8 \times 10^{19}$ cm$^{-3}$) p-doped GaAs indicated spin relaxation times of ~50 ps at room temperature. Transit times much lower than this (~1 ps) can be achieved with a sufficiently thin base. Then the coupling between Eqs. (4) and (5) can be neglected, and the decay of the two spin components in the base is determined by the differing mobilities, diffusion constants, and recombination times. Where the charge current is the sum of these and the spin-polarized charge current is the difference of the two, it is indicated by $J_{E\uparrow}$ and $J_{E\downarrow}$. The drift field in the base can be neglected and denote the diffusion lengths $L_s = \sqrt{D_s \tau_{Rs}}$. Hence the spin-polarizing effect of spin-selective carrier recombination is contained within the diffusion lengths, and the spin-filtering effect at the emitter-base interface manifests itself through the equilibrium carrier density. The emitter current density for spin direction s is $$J_{Es} = \frac{qD_{Bs}n_{Bso}}{L_{Bs}\sinh(W/L_{Bs})}[(e^{-qV_{EB}/kT} - 1)\cosh(W/L_{Bs}) - \\ (e^{-qV_{CB}/kT} - 1)] - \frac{qD_{EPEo}}{L_E}[p^{-qV_{EB}/kT} - 1]. \quad (6)$$

the collector current is $$J_{Cs} = \frac{qD_{Bs}n_{Bso}}{L_{Bs}\sinh(W/L_{Bs})}[(e^{-qV_{EB}/kT} - 1) - \\ (e^{-qV_{CB}/kT} - 1)\cosh(W/L_{Bs})] + \frac{qD_{CPCo}}{L_C}[e^{-qV_{CB}/kT} - 1]. \quad (7)$$

and the base current is $$J_{Bs} = J_{Es} - J_{Cs}. \quad (8)$$

The base width is W, the voltage between emitter and base is $V_{BE}$, and the voltage between collector and base is $V_{CB}$. When $W/L_{Bs}$ is small, $J_{Bs} \ll J_{Cs}$, which is the desired situation for transistor operation (current gain $J_C/J_B \gg 1$). It is assumed that a sufficiently wide-gap emitter material has been employed, and therefore hole current into the emitter (emitter efficiency $\gamma \sim 1$) is neglected. For appropriate values of $V_{EB}$ and $V_{CB}$ ($V_{EB} < 0$ and $V_{CB} > 0$), $$J_{Cs} = -\frac{qD_{Bs}n_{Bso}(e^{-qV_{EB}/kT} - 1)}{L_{Bs}\sinh(W/L_{Bs})}. \quad (9)$$

$$J_{Es} = -\frac{qD_{Bs}n_{Bso}(e^{-qV_{EB}/kT} - 1)}{L_{Bs}\tanh(W/L_{Bs})}. \quad (10)$$

The spin polarization of the emitter and collector currents can now be analyzed. For Eqs. (9), (10), for $W/L_{Bs} \ll 1$, the spin polarization of each of these currents is equal to the equilibrium spin polarization density of minority carriers in the base.

$$\frac{J_\uparrow - J_\downarrow}{J_\uparrow + J_\downarrow} = \frac{n_{B\uparrow o} - n_{B\downarrow o}}{n_{B\uparrow o} + n_{B\downarrow o}}. \quad (11)$$

Hence, expectations guided by Eq. (1) for thin bases can be verified. The spin polarization of the collector current can be larger or smaller than this for thicker bases, but in those situations the difference between the collector current and emitter current grows, indicating a larger (undesirable) base current.

The current amplifying properties of this device have been emphasized to this point. For greatest functionality, however, the magnitude and orientation of the collector current spin polarization should also be controllable. Magnetic techniques for controlling the base magnetization are available through standard magnetic domain writing technology. The disclosure below, therefore, describes some more unusual electrical and optical techniques for controlling the base magnetization in this device. Control of the base magnetization permits control of the conduction-band spin splitting and the hole-sea spin polarization (hence the spin-selective recombination and spin relaxation rates). These properties control the degree of spin-polarization of the collector current.

Electrical control of the Curie temperature in the magnetic semiconductor InMnAs has been demonstrated. An implementation relevant to the spin transistor proposed here is for the magnetic base to be in contact with a nonmagnetic p-doped semiconductor material. If a voltage is applied between this semiconducting material and the base then holes can be depleted from the base. That will reduce the Curie temperature without significantly affecting minority carrier (electron) transport through the base.

Optical injection of real carriers into the base or the optical Stark effect could be used for optical control of the base magnetization or spin filtering properties. If the base layer had a band gap smaller than the emitter or collector the photon energy could be set for maximal absorption in the base. Electrons optically injected into the base would be rapidly swept out towards the emitter or collector, leaving behind the holes. As the Curie temperature and magnetization of such magnetic semiconductors increases with increasing hole density, this optical injection process could be sufficient to drive the base into the ferromagnetic phase (a transition requiring only a $5 \times 10^{18}$ cm$^{-3}$ change in hole density). If sufficient spin-polarized holes were injected optically the orientation of the resulting base magnetization in the ferromagnetic phase might even be set by the injected hole polarization. As the electrons injected into the base are swept out and are not easily available to recombine with the base holes, the nonequilibrium hole population can persist for a considerable time.

The spin-selective optical Stark effect permits much faster manipulation of the spin polarization in the collector through enhancing or reducing the spin splitting in the base. Virtual transitions induced by sub-resonant photons create shifts in the energies of the conduction band edge in the base. If the illumination is by circularly polarized light then the shifts will differ for the two spin directions. Depending on whether the polarization of the sub-resonant light is parallel or antiparallel to the spin orientation of the lowest conduction band, the spin splitting will either decrease or increase. This effect persists only as long as the optical field is on, and hence could permit rapid manipulation of the spin polarization of the collector current. Illumination with polarization oblique to the base magnetization would produce coherent precession of electrons passing through the base.

Throughout this application and attachments hereto, various publications may have been referenced. The disclosures of these publications in their entireties are hereby incorporated by reference into this application in order to more fully describe the state of the art to which this invention pertains. Additionally, more background information can be found in the attached list of references. It is intended that the specification and examples be considered as exemplary only.

The embodiments described above are given as illustrative examples only. It will be readily appreciated by those skilled in the art that many deviations may be made from the specific embodiments disclosed in this specification without departing from the scope of the invention.

We claim:

1. A method of changing spin polarization of electric current, comprising the steps of:
   (a) providing a bipolar transistor having a first semiconductor region, a single ferromagnetic layer, and a third semiconductor region comprising,
      (i) providing the first semiconductor region adjacent the single ferromagnetic layer, so as to form a first domain between the first semiconductor region and the single ferromagnetic layer,
      (ii) providing the third semiconductor region adjacent the single ferromagnetic layer, so as to form a second domain between the single ferromagnetic layer and the third semiconductor region,
      (iii) providing a first voltage between the first semiconductor region and the single ferromagnetic layer, so as to cause carriers having a first charge current spin polarization and first density spin polarization to move across the first domain from the first semiconductor region to the single ferromagnetic layer, and
      (iv) providing a second voltage between the single ferromagnetic layer and the third semiconductor region, so as to cause the carriers to move across the second domain from the single ferromagnetic layer to the third semiconductor region, wherein the second voltage has an amplitude different from that of the first voltage and the carriers have a second charge current spin polarization in the third semiconductor region that is greater than the first charge current spin polarization and the first density spin polarization, respectively, wherein said first semiconductor region is an emitter, said single ferromagnetic layer is a base, and said third semiconductor region is a collector,
   wherein said bipolar spin transistor is configured to create a spin-polarized current of highly spin-polarized electrons in the third semiconductor region by one of spin-split minority carrier bands in the single ferromagnetic layer, spin-selective minority carrier spin flipping in the single ferromagnetic layer, or spin selective recombination in the single ferromagnetic layer; and
   (b) providing a control adapted to be coupled to the bipolar transistor for controlling the spin-polarized current by-altering a magnetization associated with the single ferromagnetic layer by one of depleting the ferromagnetic layer and re-orienting the magnetization with a small fringe field, using spin current torque for switching the ferromagnetic layer, optically injecting real carriers into the single ferromagnetic layer, or using an optical Stark effect.

2. The method of claim 1, wherein the first semiconductor region and the third semiconductor region have negligible density spin polarization in an absence of current flow, and the single ferromagnetic layer has a density spin polarization.

3. The method of claim 1, wherein the spin polarization of the electric current is amplified by the bipolar transistor.

* * * * *